United States Patent
Kim

(10) Patent No.: US 10,553,296 B2
(45) Date of Patent: Feb. 4, 2020

(54) MEMORY DEVICE AND OPERATING METHOD THEREOF

(71) Applicant: SK hynix Inc., Gyeonggi-do (KR)

(72) Inventor: Tae-Hoon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/157,710

(22) Filed: Oct. 11, 2018

(65) Prior Publication Data

US 2019/0304553 A1    Oct. 3, 2019

(30) Foreign Application Priority Data

Mar. 28, 2018    (KR) ........................ 10-2018-0036123

(51) Int. Cl.
| | |
|---|---|
| *G11C 16/26* | (2006.01) |
| *G11C 16/34* | (2006.01) |
| *G11C 16/08* | (2006.01) |
| *G11C 16/30* | (2006.01) |
| *G11C 11/56* | (2006.01) |
| *G11C 16/04* | (2006.01) |

(52) U.S. Cl.
CPC .......... *G11C 16/3431* (2013.01); *G11C 16/08* (2013.01); *G11C 16/26* (2013.01); *G11C 16/30* (2013.01); *G11C 11/5642* (2013.01); *G11C 11/5671* (2013.01); *G11C 16/0483* (2013.01)

(58) Field of Classification Search
CPC .................................. G11C 16/26; G11C 8/12
USPC ......................................... 365/185.12, 230.03
See application file for complete search history.

(56) References Cited

U.S. PATENT DOCUMENTS

| | | | |
|---|---|---|---|
| 2015/0262630 A1* | 9/2015 | Shirakawa | G11C 7/1063 711/125 |
| 2016/0357454 A1* | 12/2016 | Lee | G06F 3/0611 |
| 2018/0040362 A1* | 2/2018 | Kwak | G11C 7/12 |
| 2018/0061496 A1* | 3/2018 | Senoo | G11C 16/0483 |
| 2018/0090218 A1* | 3/2018 | Takada | G11C 7/04 |
| 2018/0102790 A1* | 4/2018 | Oh | G11C 16/26 |
| 2018/0108419 A1* | 4/2018 | Lin | G06F 1/3225 |
| 2018/0113760 A1* | 4/2018 | Bhatia | G06F 11/1012 |
| 2018/0136860 A1* | 5/2018 | Lim | G06F 3/0619 |
| 2018/0137060 A1* | 5/2018 | Park | G06F 3/0608 |
| 2018/0143886 A1* | 5/2018 | Liu | G06F 11/1471 |
| 2018/0150252 A1* | 5/2018 | Lewis | G11C 5/148 |
| 2018/0190498 A1* | 7/2018 | Lee | G11C 11/5628 |
| 2019/0028661 A1* | 1/2019 | Nikai | H04N 5/341 |
| 2019/0088317 A1* | 3/2019 | Roy | G11C 13/004 |

(Continued)

FOREIGN PATENT DOCUMENTS

| | | |
|---|---|---|
| KR | 1020150053705 | 5/2015 |
| KR | 1020170052024 | 5/2017 |
| KR | 1020170094775 | 8/2017 |

*Primary Examiner* — Michael T Tran
(74) *Attorney, Agent, or Firm* — IP & T Group LLP

(57) ABSTRACT

A memory device includes a memory cell array including a plurality of memory cells coupled to a plurality of word lines and a plurality of bit lines; a read/write circuit including a plurality of page buffers coupled to the plurality of bit lines; a power supply circuit suitable for generating voltages to be applied to the memory cell array and the read/write circuit; and a control circuit suitable for receiving a read command and an address signal from an external device, and controlling the memory cell array, the read/write circuit and the power supply circuit based on the read command and the address signal.

20 Claims, 10 Drawing Sheets

(56) References Cited

U.S. PATENT DOCUMENTS

| | | | |
|---|---|---|---|
| 2019/0139976 A1* | 5/2019 | Lee | H01L 27/11573 |
| 2019/0157282 A1* | 5/2019 | Jung | H01L 27/11556 |
| 2019/0188134 A1* | 6/2019 | Jeong | G06F 12/0804 |
| 2019/0208151 A1* | 7/2019 | Taura | H04N 5/37455 |
| 2019/0214091 A1* | 7/2019 | Lee | G11C 16/26 |
| 2019/0278520 A1* | 9/2019 | Xu | G11C 11/419 |

* cited by examiner

MEMORY DEVICE AND OPERATING METHOD THEREOF

CROSS-REFERENCE TO RELATED APPLICATIONS

The present application claims priority under 35 U.S.C. § 119(a) to Korean Patent Application No. 10-2018-0036123 filed on Mar. 28, 2018, the disclosure of which is incorporated herein by reference in its entirety.

BACKGROUND

1. Field

Various exemplary embodiments of the present invention relate to a memory device. Particularly, exemplary embodiments relate to a memory device capable of efficiently managing data, and an operating method thereof.

2. Description of the Related Art

The paradigm for computing environments moves toward ubiquitous computing which provides people or users to use their or commonly supplied computing systems anytime anywhere. In the era of ubiquitous computing, the demand for portable electronic devices, such as mobile phones, digital cameras and laptop computers are soaring. Those electronic devices generally include a memory system using a memory device as a data storage device. The data storage device may be used as a main memory or an auxiliary memory of a portable electronic device.

Since a data storage device using a memory device does not have a mechanical driving unit (e.g., a mechanical arm with a read/write head) as compared with a hard disk device, it may have excellent stability and durability. Also, the data storage device can have a faster data access rate with low power consumption than the hard disk device. Non-limiting examples of the data storage device having such advantages include Universal Serial Bus (USB) memory devices, memory cards of diverse interfaces, Solid-State Drives (SSD) and the like.

SUMMARY

Various embodiments of the present invention are directed to a memory device capable of performing efficiently a read retry operation.

In accordance with an embodiment of the present invention, a memory device may include: a memory cell array including a plurality of memory cells coupled to a plurality of word lines and a plurality of bit lines; a read/write circuit including a plurality of page buffers coupled to the plurality of bit lines; a power supply circuit suitable for generating voltages to be applied to the memory cell array and the read/write circuit; and a control circuit suitable for receiving a read command and an address signal from an external device, and controlling the memory cell array, the read/write circuit and the power supply circuit based on the read command and the address signal, wherein the control circuit includes: a read/write operation component suitable for controlling a page buffer coupled to a bit line corresponding to the address signal to load premature data and main data onto the page buffer, at different times; a detection component suitable for detecting the number of flip-bits between the loaded premature data and the loaded main data; and a read retry operation component suitable for performing a read retry operation based on the number of the flip-bits and a read retry table in which levels of a plurality of read voltages are recorded.

In accordance with an embodiment of the present invention, applying a read voltage to a word line corresponding to the address signal; loading premature data and main data onto a page buffer coupled to a bit line corresponding to the address signal, at different times; detecting the number of flip-bits between the premature data and the main data; and performing a read retry operation based on the number of the flip-bits and a read retry table in which levels of a plurality of read voltages are recorded.

In accordance with an embodiment of the present invention, a memory device may include: a memory cell array including a plurality of memory cells coupled to a plurality of word lines and a plurality of bit lines; a plurality of page buffers coupled to each of the plurality of bit lines, each page buffer including a sub-latch suitable for loading premature data and a main latch onto suitable for loading main data; a power supply circuit suitable for applying a read voltage to a word line; and a control circuit suitable for controlling the memory cell array, the plurality of page buffers and the power supply circuit to perform a read operation and a read retry operation, wherein the control circuit loads the premature data and the main data at different times, detects a number of flip-bits between the premature data and the main data, and performs a read retry operation based on the number of the flip-bits and a read retry table in which levels of a plurality of read voltages are recorded.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
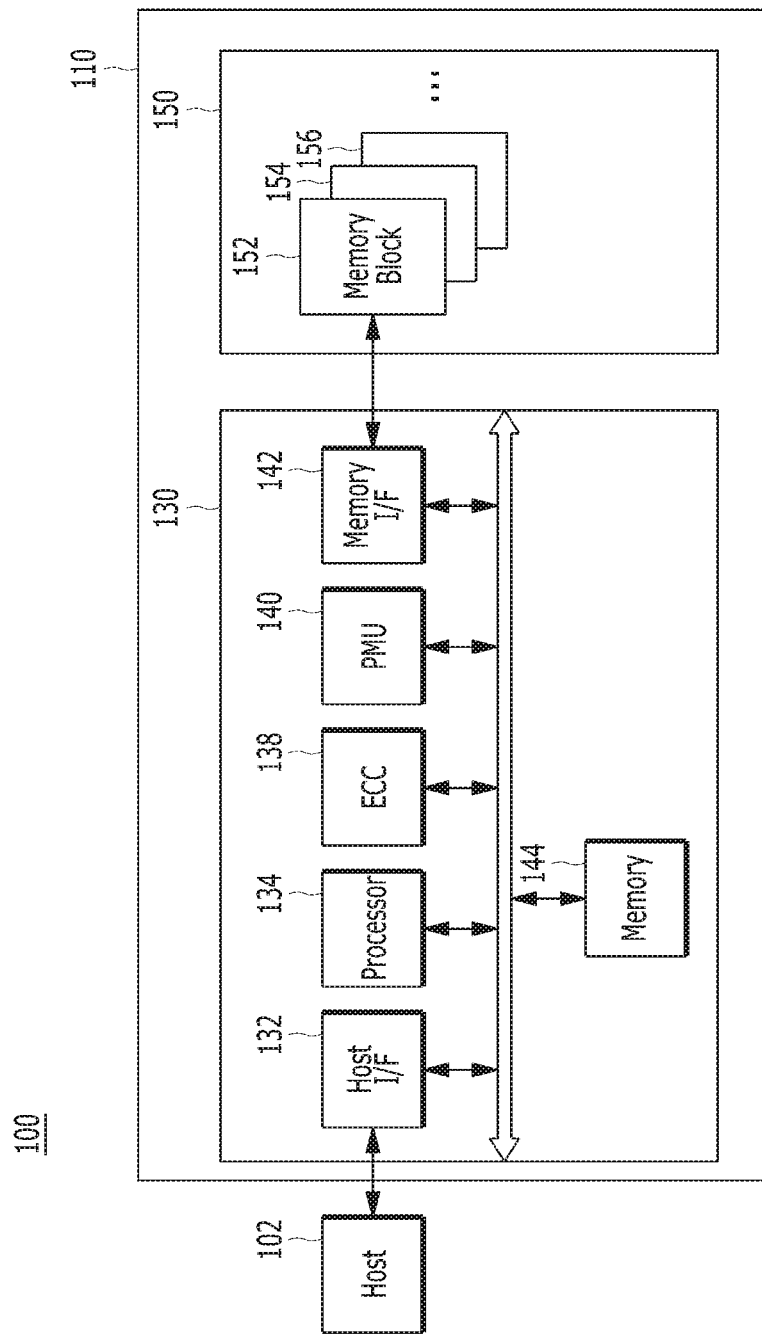
FIG. 1 is a block diagram illustrating a data processing system including a memory system in accordance with an embodiment of the present invention.

Various embodiments of the disclosure of the present invention are described below in more detail with reference to the accompanying drawings. It is noted, however, that the invention may be embodied in different other embodiments, forms and variations thereof and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a TV, a projector and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and a flash memory.

The memory system 110 may include a memory device 150 which stores data to be accessed by the host 102, and a controller 130 which may control storage of data in the memory device 150.

The controller 130 and the memory device 150 may be integrated into a single semiconductor device, which may be included in the various types of memory systems as exemplified above.

The memory system 110 may be configured as a part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the plurality of pages may include a plurality of memory cells to which a plurality of word lines (WL) are electrically coupled.

The controller 130 may control overall operations of the memory device 150, such as read, write, program and erase operations. The controller 130 of the memory system 110 may control the memory device 150 in response to a request from the host 102. The controller 130 may provide the data, read from the memory device 150, to the host 102, and/or may store the data, provided by the host 102, into the memory device 150.

The controller 130 may include a host interface (I/F) 132, a processor 134, an error correction code (ECC) 138, a power management unit (PMU) 140, a memory interface (I/F) 142 and a memory 144 all operatively coupled via an internal bus. The memory interface (I/F) 142, the memory 144 may serve as a memory device controller.

The host interface 132 may process commands and data provided from the host 102, and may communicate with the host 102 through at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC 138 may detect and correct errors in the data read from the memory device 150 during the read operation. When the number of the error bits is greater than or equal to a threshold number of correctable error bits, the ECC 138 may not correct error bits but may output an error correction fail signal indicating failure in correcting the error bits.

The ECC 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC 138 may include all or some of circuits, modules, systems or devices for performing the error correction operation based on at least one of the above described codes.

The PMU 140 may provide and manage power of the controller 130.

The memory interface 142 may serve as an interface for handling commands and data transferred between the controller 130 and the memory device 150, so as to allow the controller 130 to control the memory device 150 in response to a request delivered from the host 102. The memory interface 142 may generate a control signal for the memory device 150 and may process data entered into or outputted from the memory device 150 under the control of the processor 134, in a case when the memory device 150 is a flash memory and, in particular, when the memory device 150 is a NAND flash memory.

The memory 144 may serve as a working memory of the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory. The memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located inside or outside the controller 130. For instance, the memory 144 may be embodied by an external volatile memory having a memory interface transferring data and/or signals transferred between the memory 144 and the controller 130.

The processor 134 may control the overall operations of the memory system 110. The processor 134 may drive or execute a firmware to control the overall operations of the memory system 110. The firmware may be referred to as a flash translation layer (FTL).

The FTL may perform an operation as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data on another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not shown) may be included in the processor 134. The management unit may perform bad block management of the memory device 150. The management unit may find bad memory blocks included in the memory device 150, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 100, and thus reliable bad block management is required.

Figure 2:
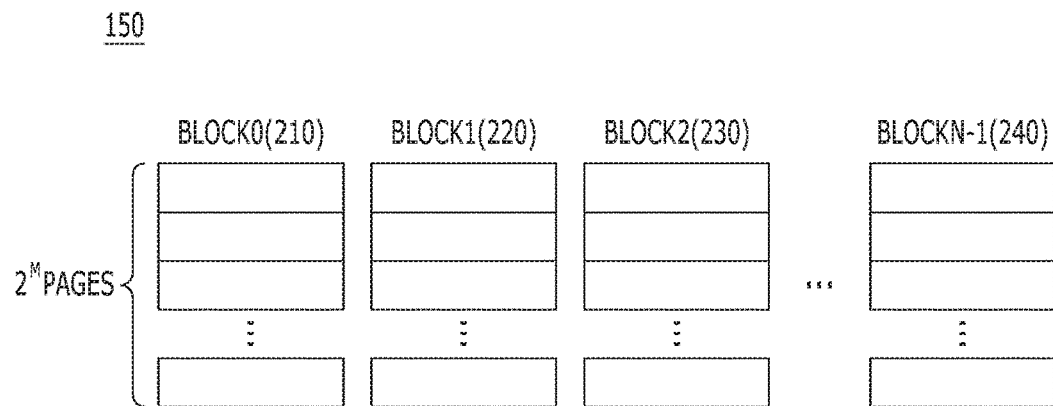
FIG. 2 is a schematic diagram illustrating an exemplary configuration of a memory device of the memory system shown in FIG. 1.

FIG. 2 is a schematic diagram illustrating the memory device 150.

Referring to FIG. 2, the memory device 150 may include the plurality of memory blocks BLOCK 0 to BLOCKN−1, and each of the blocks BLOCK 0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
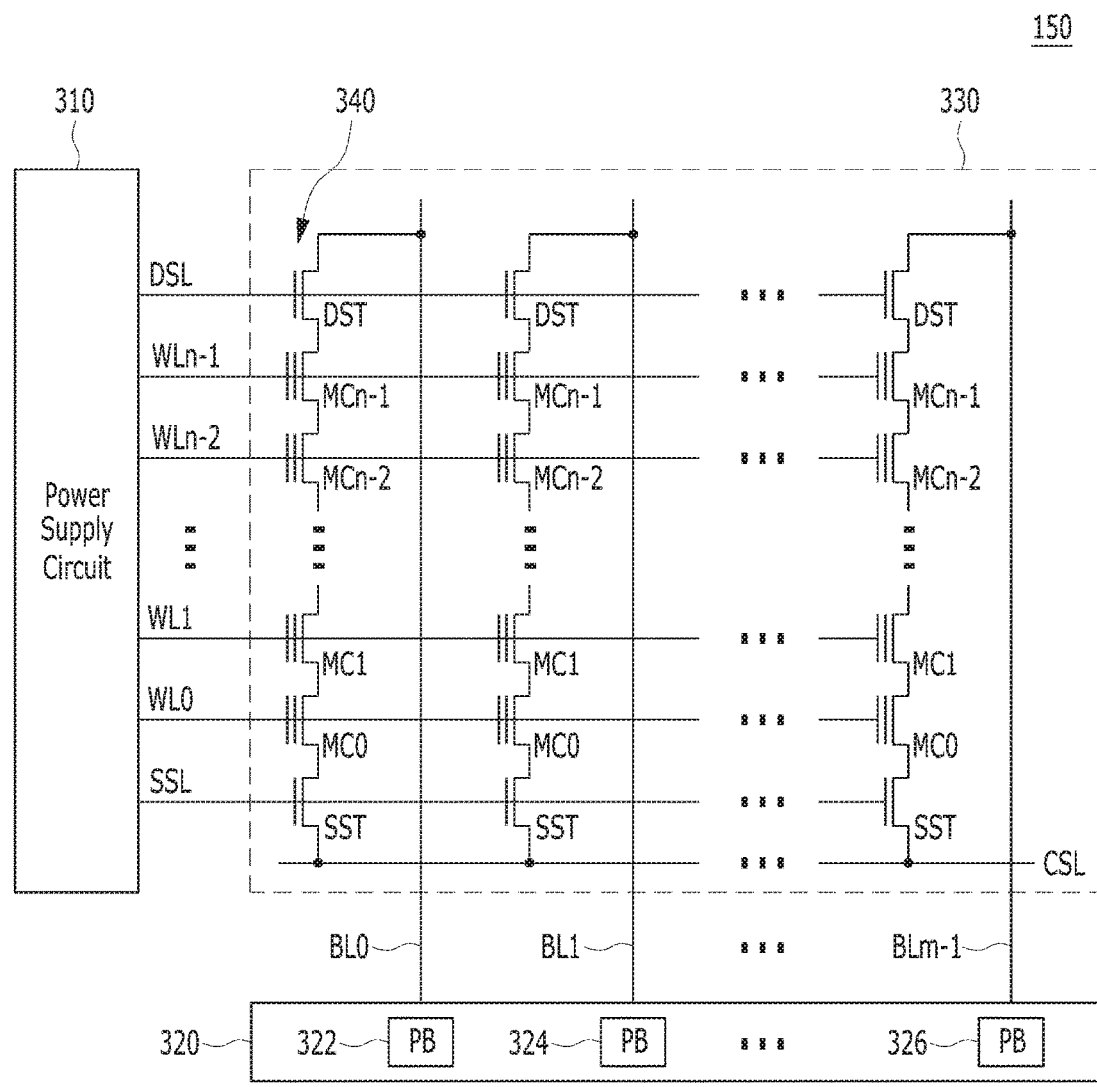
FIG. 3 is a circuit diagram illustrating an exemplary configuration of a memory cell array of a memory block in the memory device shown in FIG. 2.

FIG. 3 is a circuit diagram illustrating a memory block 330 in the memory device 150.

Referring to FIG. 3, the memory block 330 may correspond to any of the plurality of memory blocks 152 to 156.

Referring to FIG. 3, the memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, that the memory block 330 is constituted with NAND flash memory cells, it is to be noted that the memory block 330 of the memory device 150 according to the embodiment is not limited to a NAND flash memory. The memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
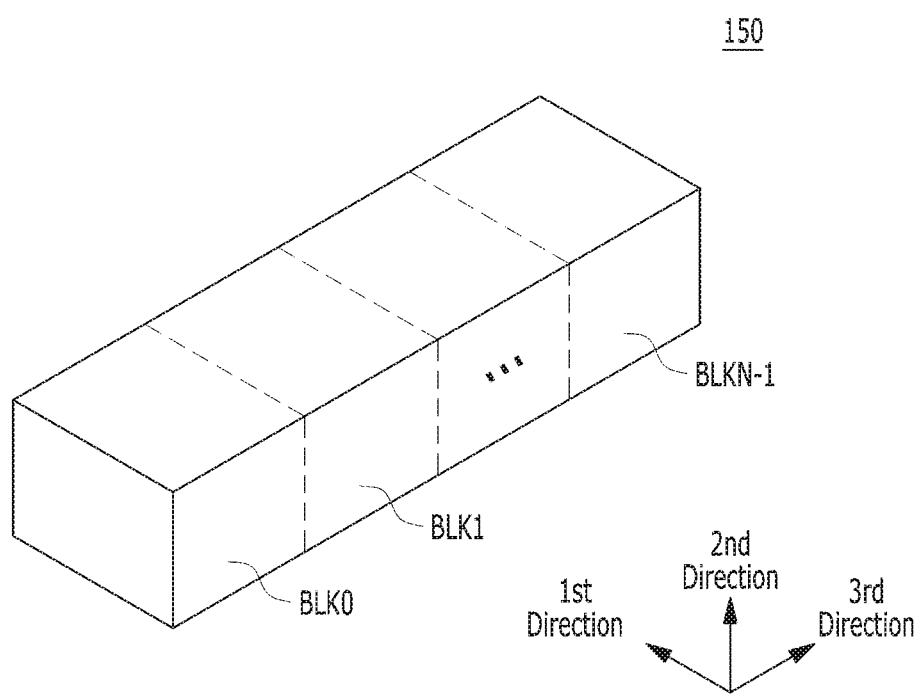
FIG. 4 is a schematic diagram illustrating an exemplary three-dimensional structure of the memory device shown in FIG. 2.

FIG. 4 is a schematic diagram illustrating a 3D structure of the memory device 150.

Referring to FIG. 4, the memory device 150 may be embodied in a nonvolatile memory device having a 3D stack structure. The memory device 150 may include a plurality of memory blocks BLK0 to BLKN−1 each having a 3D structure (or a vertical structure).

Referring back to FIG. 3, the voltage supplied from the voltage supply circuit 310 may be applied to each of the word lines. However, when a voltage having an erroneous level is applied to the word line in a read operation, uncorrectable ECC (hereinafter, referred to as UECC) may occur. In this case, a read retry operation may be performed. The read retry operation refers to a read operation performed once again based on a changed level of the applied voltage when the UECC occurs in the read operation. The memory device 150 in accordance with an embodiment of the present invention may efficiently perform the read retry operation without the control of the controller 130.

Figure 5:
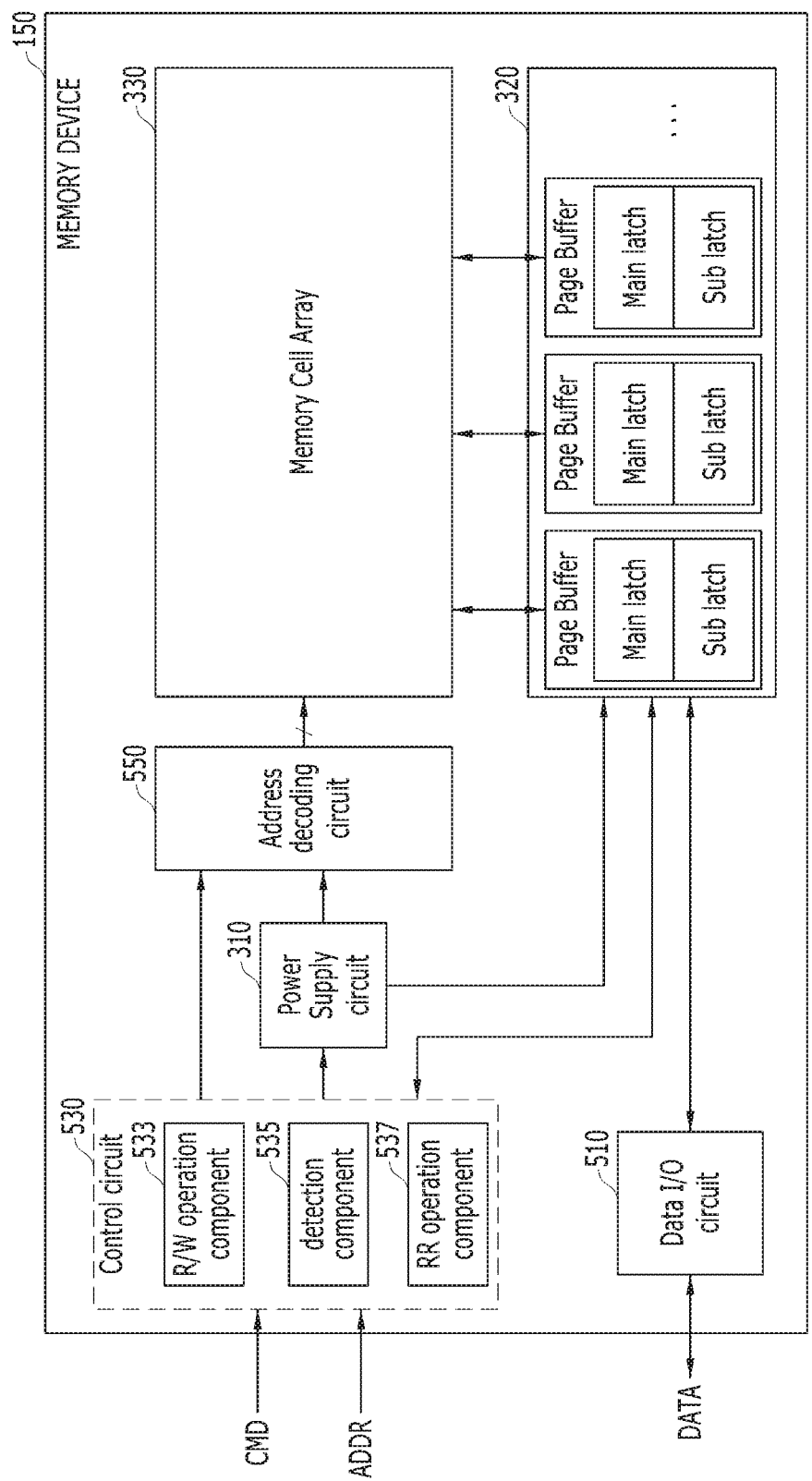
FIG. 5 is a block diagram illustrating a structure of the memory device in accordance with an embodiment of the present invention.

FIG. 5 is a block diagram illustrating a structure of the memory device 150 in accordance with an embodiment of the present invention.

The memory device 150 may include a data input/output (I/O) circuit 510, a control circuit 530, and an address decoding circuit 550 in addition to the power supply circuit 310, the read/write circuit 320 and the memory cell array 330 that are shown in FIG. 3.

The power supply circuit 310 may operate in response to control of the control circuit 530. The power supply circuit 310 may generate a plurality of voltages under the control of the control circuit 530. The power supply circuit 310 may generate a plurality of voltages based on an external power source supplied to the memory device 150 under the control of the control circuit 530. The plurality of voltages may be transferred to the various relevant elements (e.g., the address decoding circuit 550 and the read/write circuit 320) for a read operation or a write operation as may be needed. For example, the power supply circuit 310 may transfer a read voltage to each of the address decoding circuit 550 and the read/write circuit 320 to perform a read operation.

The memory cell array 330 may include a plurality of memory cells arranged in a lattice structure. The lattice structure may be preferably a three-dimensional lattice. The lattice may be formed by coupling a plurality of word lines and a plurality of bit lines.

The read/write circuit 320 may include a plurality of page buffers corresponding to the bit lines. Each page buffer may correspond to a bit line. Each page buffer may include a main latch and a sub-latch.

The data input/output circuit 510 may receive data from an external device (e.g., the controller 130) and/or transfer data to the external device. The data input/output circuit 510 may communicate data with the read/write circuit 320. For example, when a program operation is performed, the data input/output circuit 510 may transfer write data received from the external device to the read/write circuit 320 through a data line. When a read operation is performed, the read/write circuit 320 may transfer read data to the data input/output circuit 510 through the same or a different data line. The data input/output circuit 510 may output the read data to the external device.

The control circuit 530 may include a read/write (R/W) operation component 533, a detection component 535, and a read retry (RR) operation component 537.

The R/W operation component 533 may generate a row address signal and a column address signal based on a command signal CMD and an address signal ADDR. Specifically, the control circuit 530 may receive a read command and an address signal corresponding to the read command. The R/W operation component 533 of the control circuit may then generate a row address signal based on the received read command and address signal and transfer the row address signal to the address decoding circuit 550. The R/W operation component 533 may also generate a column address signal based on the command signal CMD and address signal ADDR and transfer the column address signal to the read/write circuit 320.

The power supply circuit 310 may supply a voltage to be applied to a word line corresponding to the row address signal to the address decoding circuit 550, and the address decoding circuit 550 may apply the voltage supplied from the power supply circuit 310 to the word line corresponding to the row address signal. The power supply circuit 310 may supply a voltage to be applied to a bit line corresponding to the column address signal to the read/write circuit 320, and the read/write circuit 320 may drive the bit line corresponding to the column address signal. The voltage applied to the word line and/or the bit line may be a voltage for performing the read operation, which will be hereinafter referred to as a "read voltage".

After the read voltage is applied to the word line and/or the bit line, each of the main latch and the sub-latch that are included in the page buffer corresponding to the bit line driven by the read/write circuit 320 may load the read data through the driven bit line at different loading times. Specifically, the sub-latch may load the read data at a first loading time. The main latch may load the read data at a second loading time. The second loading time is the time that is sufficient to normally read the data. The first loading time is less than the second loading time. The read data loaded onto the sub-latch includes premature data (hereinafter also referred to as "pre-data"), and the read data loaded onto the main latch is the data which is fully loaded (hereinafter referred to as "main data"). In other words, the sub-latch and the main latch may load the pre-data and the main data, respectively. For example, when the read data is '10011001', the sub-latch may load '10010110' at the first loading time. In other words, in this example, only the first 4 bits, i.e., only some of the bits making the read data, may be normally read, and the last 4 bits of the read data may be erroneously read. The main latch may load '10011001' at the second loading time. It is noted that this is merely an example, and the present invention is not limited thereto. Generally, at the first loading time only some of the bits of the data may be loaded correctly while at the second loading time all the bits may be loaded correctly.

The detection component 535 may detect bits which are flipped between the pre-data which are loaded onto the sub-latch and the main data which are loaded onto the main latch (hereinafter referred to as "flip-bits"). And, the closer the first loading time and the second loading time are, the more the detection component 535 may detect bits which are flipped between the pre-data and the main data. In an embodiment, the detection component 535 may compare a number of the detected flip-bits with a predetermined threshold value. The predetermined threshold value may be set by designer. The predetermined threshold value may be stored in the detection component 535. The number of the detected flip-bits may represent whether or not the read operation is normally performed. For example, let us assume that the read data is '10101011'. When the pre-data is '10010011' and the main data is '10101001', the detection component 535 may detect four flip-bits. When the pre-data is '10010011' and the main data is '10101011', the detection component 535 may detect three flip-bits. In other words, it may be seen that the main data having a smaller number of the flip-bits has a higher probability of normally performing the read operation than the pre-data.

The RR operation component 537 may determine whether a read operation is attributable to an erroneous read voltage based on the number of the detected flip-bits. In addition, the RR operation component 537 may change the read voltage and perform the read operation again based on the changed read voltage. For example, when the number of the detected flip-bits is equal to or greater than the predetermined threshold value, the RR operation component 537 may determine that the read operation performed on the detected data is an erroneous read operation.

For example, the RR operation component 537 may store a read retry table in which a plurality of levels of the read voltage are recorded. There may be a predetermined priority between the plurality of levels of the read voltage. Accordingly, when it is determined that a read operation performed on the detected data is an erroneous read operation, the RR operation component 537 may change the read voltage to another read voltage level based on the predetermined priority of the read voltage levels in the read retry table, and control the relevant elements to re-perform the read operation as described above based on the changed read voltage.

The operations of changing the level of the read voltage and loading the pre-data and the main data to re-read the data are referred to as "a read retry (RR) operation", the RR operation component 537 may perform the RR operation as many as a predetermined number of times. The predetermined number of times may be set by a user, and information on the predetermined number of times may be stored in the RR operation component 537. When the number of times of performing the RR operation is equal to or greater than the predetermined number of times, the control circuit 530 may perform an eBoost algorithm for target data for improving their accuracy. That is, the control circuit 530 may directly retrieve an optimum level of the read voltage for the target data. The use of an eBoost algorithm is well known as an operation for retrieving the optimum level of a read voltage.

On the other hand, when the number of the detected bits is smaller than the predetermined threshold value, the main data may be outputted. Specifically, the read/write circuit 320 may transfer the main data loaded onto the main latch to the data input/output circuit 510 through the data line, and the data input/output circuit 510 may output the main data to the external device.

Figure 6:
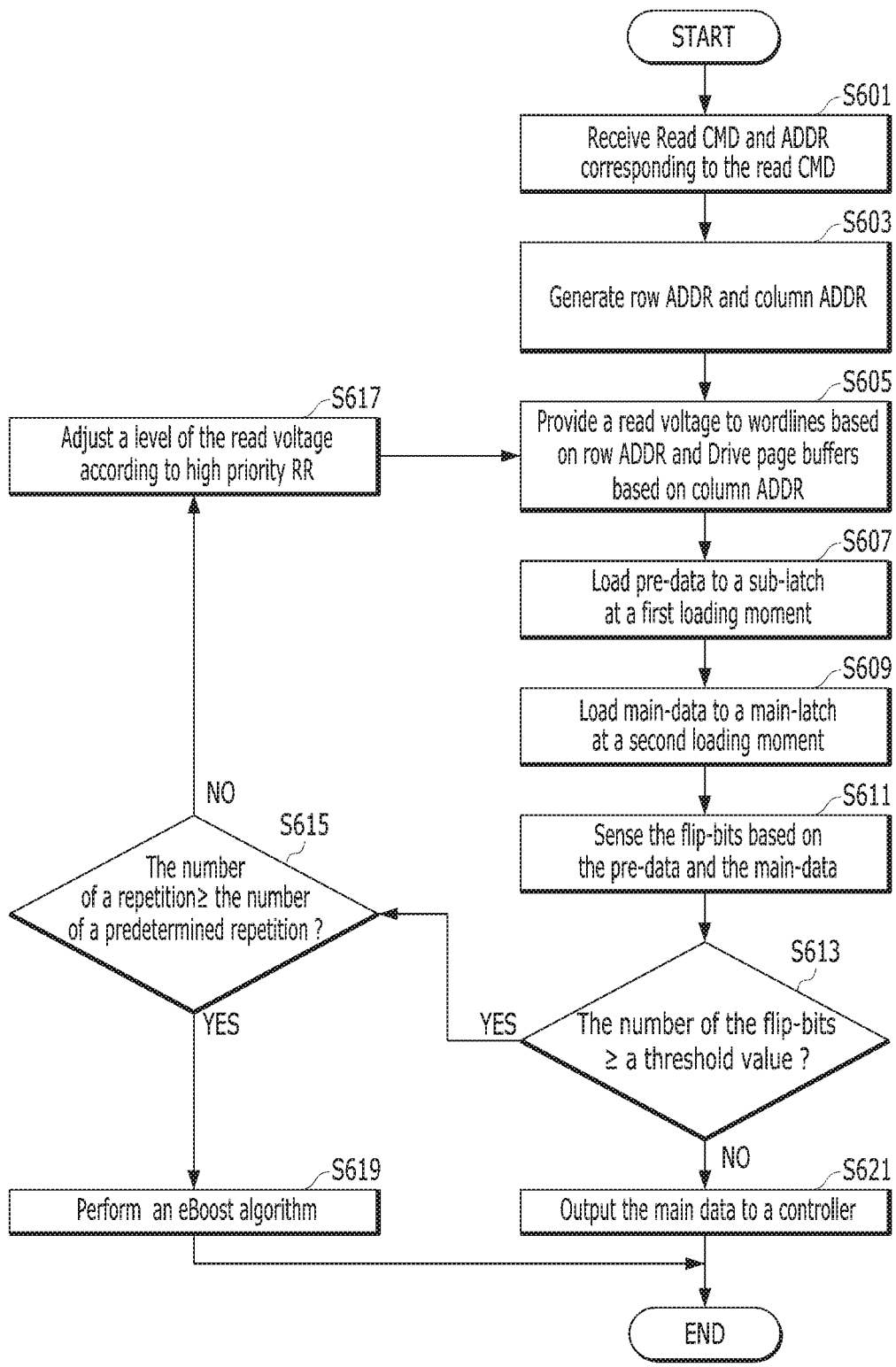
FIG. 6 is a flowchart illustrating an operation of the memory device in accordance with an embodiment of the present invention.

FIG. 6 is a flowchart illustrating an operation of the memory device 150 in accordance with an embodiment of the present invention.

In step S601, the control circuit 530 may receive a read command and an address signal corresponding to the read command from an external device (e.g., the controller 130).

In step S603, the R/W operation component 533 may generate a row address signal "row ADDR" and a column address signal "column ADDR" based on the read command and the address signal.

In step S605, the R/W operation component 533 may transfer the row address signal "row ADDR" to the power supply circuit 310 and the address decoding circuit 550. As described earlier, the address decoding circuit 550 may apply a read voltage transmitted from the power supply circuit 310 to a corresponding word line based on the row address signal "row ADDR". The R/W operation component 533 may transfer the column address signal "column ADDR" to the read/write circuit 320. As described with reference to FIG. 5, the read/write circuit 320 may drive a corresponding page buffer based on the column address signal "column ADDR".

In step S607, the sub-latch included in the driven page buffer may load the pre-data at a first loading moment.

In step S609, the main-latch included in the driven page buffer may load the main data at a second loading moment.

In step S611, the detection component 535 may sense the flip-bits, i.e., bits flipped between the pre-data and the main data and determine their number.

In step S613, the detection component 535 may compare a number of the flip-bits with a predetermined threshold value.

When the number of the flip-bits is smaller than the predetermined threshold value (that is, "NO" in step S613), the read/write circuit 320 may transfer the main data loaded onto the page buffer to the data input/output circuit 510, and the data input/output circuit 510 may output the main data to the controller 130, in step S621. The controller 130 may perform an ECC operation on the main data received from the data input/output circuit 510. When there is no error in the main data, the controller 130 may consequently output the main data to the host 102.

On the other hand, when the number of the flip-bits is equal to or greater than the predetermined threshold value (that is, "YES" in step S613), the RR operation component 537 may compare the number of times of performing of the RR operation with a predetermined number of times in step S615.

When the number of times of performing of RR operation is smaller than the predetermined number of times (that is, "NO" in step S615), the RR operation component 537 may adjust (or change) a level of the read voltage according to a predetermined priority in step S617. Subsequently, the operations corresponding to step S605 to step S613 may be performed again based on the adjusted read voltage.

When the number of times of performing of RR operation is equal to or greater than the predetermined number of times (that is, "YES" in step S615), the RR operation component 537 may perform an eBoost algorithm described with reference to FIG. 5 in step S619.

In accordance with the embodiment of the present invention, the memory device 150 may predict an optimized read operation by comparing the flip-bits between the detected pre-data and main data at different loading times. When it is determined that the read operation is not an optimized read operation, the memory device 150 itself may perform a read retry operation. That is, the memory device 150 may more concisely and efficiently perform the read retry operation.

Hereinafter, a data processing system and electronic devices which may be constituted with the memory system 110 including the memory device 150 and the controller 130, which are described above by referring to FIGS. 1 to 6, will be described in detail with reference to FIGS. 7 to 15.

FIGS. 7 to 15 are diagrams schematically illustrating application examples employing the system of FIGS. 1 to 6 according to various embodiments.

Figure 7:
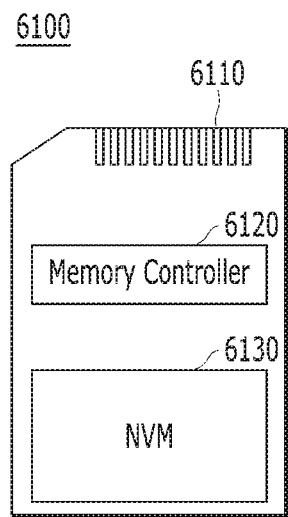
FIGS. 7 to 15 are diagrams schematically illustrating application examples of a data processing system, in accordance with various embodiments of the present invention.

FIG. 7 is a diagram schematically illustrating an example of a data processing system including a memory system in accordance with an embodiment of the present invention. Specifically, FIG. 7 schematically illustrates a memory card system.

Referring to FIG. 7, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory. By the way of example but not limitation, the memory controller 6120 may be configured to control read, write, erase and background operations onto the memory device 6130. The memory controller 6120 may be configured to provide an interface between the memory device 6130 and a host and/or a drive firmware for controlling the memory device 6130. That is, the memory controller 6120 may correspond to the controller 130 in the memory system 110 described with reference to FIGS. 1 to 6, while the memory device 6130 may correspond to the memory device 150 described with reference to FIGS. 1 to 6.

Thus, the memory controller 6120 may include a RAM, a processing, a host interface, a memory interface and an error correction. The memory controller 130 may further include the elements described in FIG. 1.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 8:
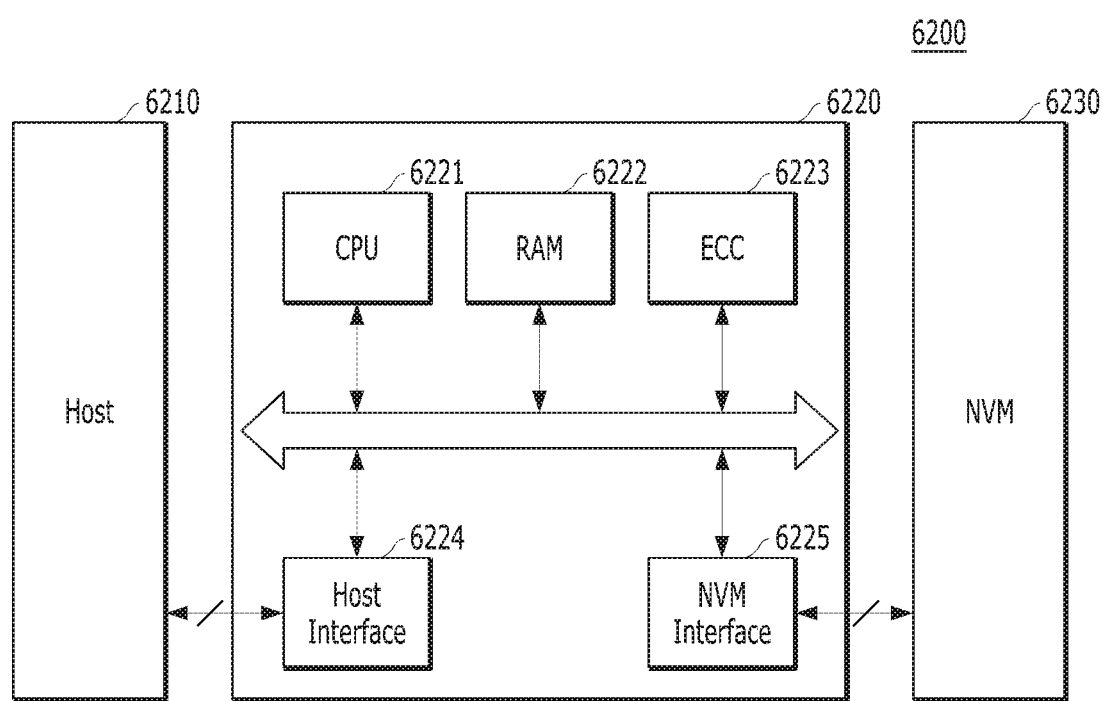

FIG. 8 is a diagram schematically illustrating another example of the data processing system including a memory system, in accordance with an embodiment.

Referring to FIG. 8, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 6, and the memory controller 6220 may correspond to the controller 130 in the memory system 110 described in FIGS. 1 to 6.

The memory controller 6220 may control a read, write, or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. In this case, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit to, or receive from, the host 6210 data or signals through the host interface 6224, and may transmit to, or receive from, the memory device 6230 data or signals through the NVM interface 6225. The host interface 6224 may be connected to the host 6210 through a PATA bus, a SATA bus, a SCSI, an USB, a PCIe, or a NAND interface. The memory controller 6220 may have a wireless communication function with a mobile communication protocol such as WiFi or Long Term Evolution (LTE). The memory controller 6220 may be connected to an external device, e.g., the host 6210, or another external device, and then transmit/receive data to/from the external device. As the memory controller 6220 is configured to communicate with the external device through one or more of various communication protocols, the memory system and the data processing system in accordance with an embodiment may be applied to wired/wireless electronic devices or particularly a mobile electronic device.

Figure 9:
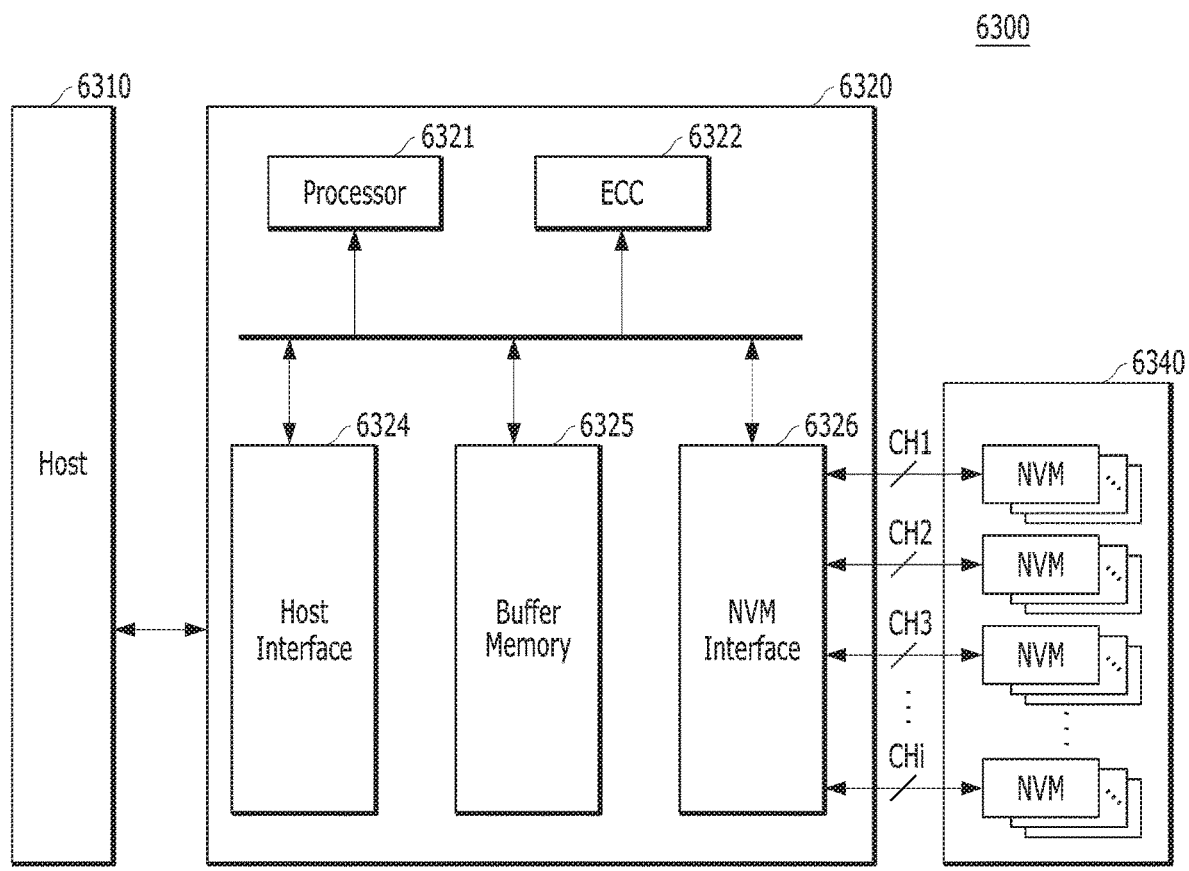

FIG. 9 is a diagram schematically illustrating another example of the data processing system including the memory system in accordance with an embodiment. FIG. 9 schematically illustrates an SSD to which the memory system in accordance with an embodiment is applied.

Referring to FIG. 9, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a DRAM, an SDRAM, a DDR SDRAM, an LPDDR SDRAM and a GRAM or nonvolatile memories such as an FRAM, a ReRAM, a STT-MRAM and a PRAM. For the purpose of description, FIG. 9 illustrates that the buffer memory 6325 exists in the controller 6320, but the buffer memory 6325 may be located or arranged outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read operation in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 10:
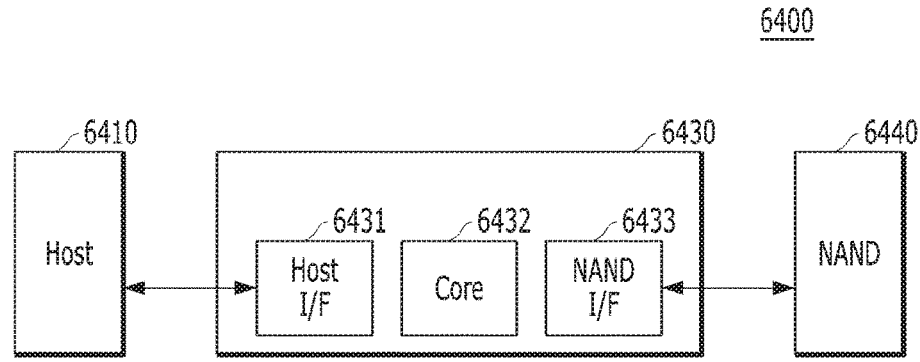
Figure 11:
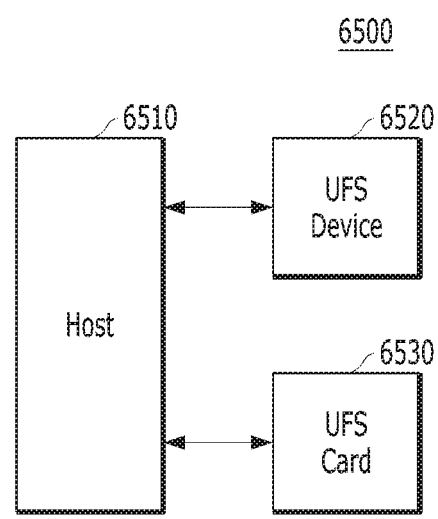
Figure 12:
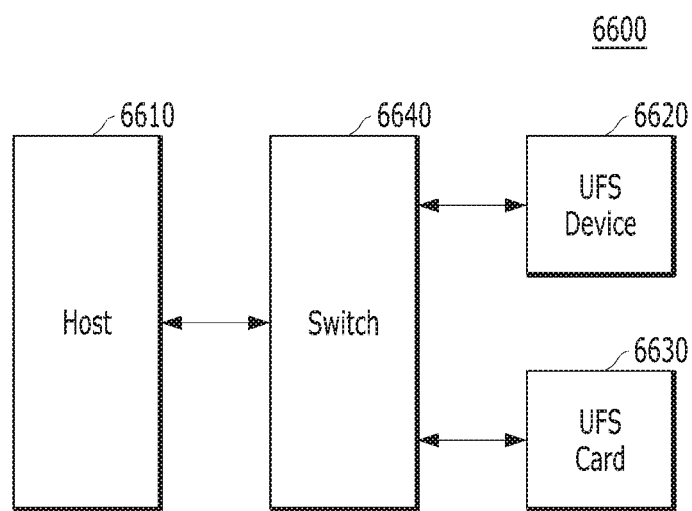
Figure 13:
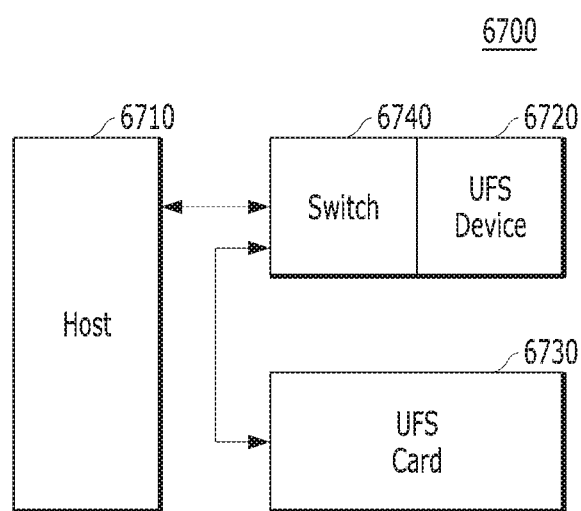
Figure 14:
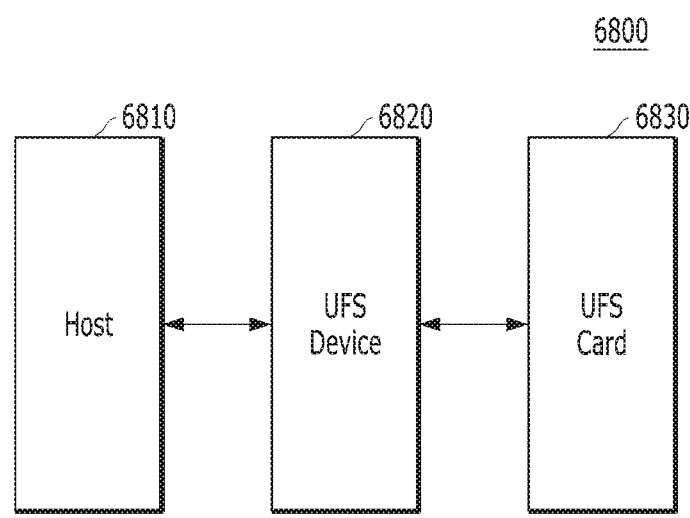

FIG. 10 is a diagram schematically illustrating another example of the data processing system including the memory system in accordance with an embodiment. FIG. 10 schematically illustrates an embedded Multi-Media Card (eMMC) to which the memory system in accordance with an embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 11 to 14 are diagrams schematically illustrating other examples of the data processing system including the memory system in accordance with an embodiment. FIGS. 11 to 14 schematically illustrate UFS (Universal Flash Storage) systems to which the memory system in accordance with an embodiment is applied.

Referring to FIGS. 11 to 14, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 8 to 10, and the UFS cards 6530, 6630, 6730, 6830 may be embodied in the form of the memory card system 6100 described with reference to FIG. 7.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., UFDs, MMC, SD, mini-SD, and micro-SD.

Figure 15:
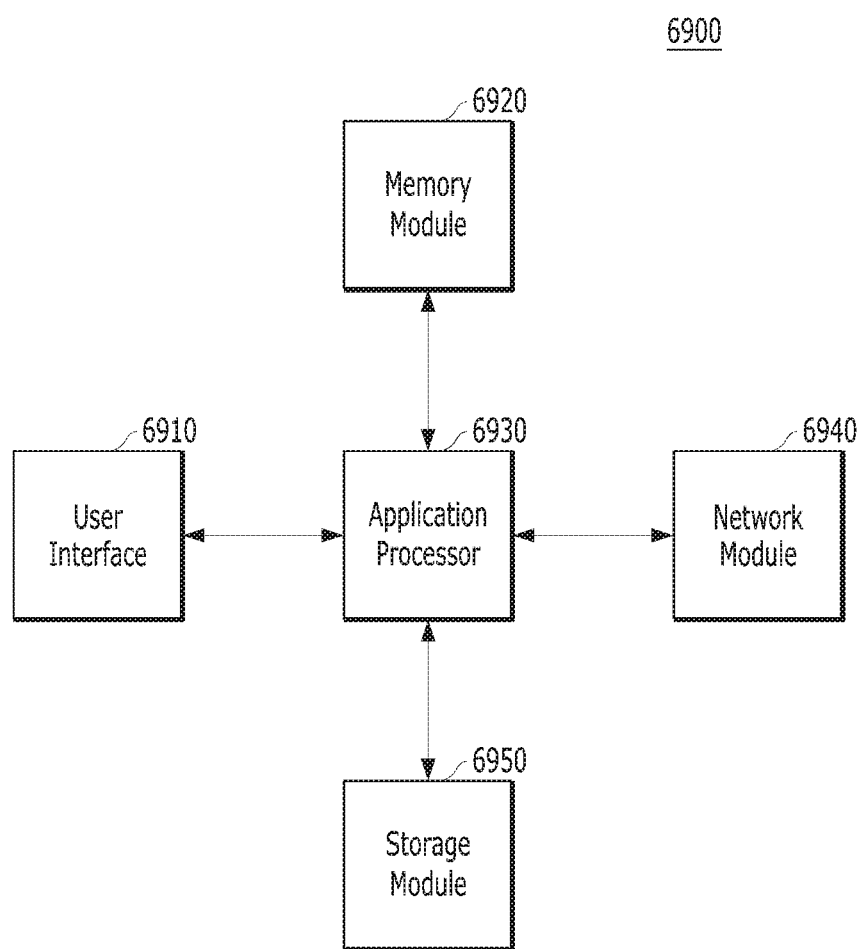

FIG. 15 is a diagram schematically illustrating another example of the data processing system including the memory system in accordance with an embodiment. FIG. 15 is a diagram schematically illustrating a user system to which the memory system in accordance with an embodiment is applied.

Referring to FIG. 15, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:

1. A memory device, comprising:
   a memory cell array including a plurality of memory cells coupled to a plurality of word lines and a plurality of bit lines;
   a read/write circuit including a plurality of page buffers coupled to the plurality of bit lines;
   a power supply circuit suitable for generating voltages to be applied to the memory cell array and the read/write circuit; and
   a control circuit suitable for receiving a read command and an address signal from an external device, and controlling the memory cell array, the read/write circuit and the power supply circuit based on the read command and the address signal,
   wherein the control circuit includes:
      a read/write operation component suitable for controlling a page buffer coupled to a bit line corresponding to the address signal to load premature data and main data onto the page buffer, at different times;
      a detection component suitable for detecting the number of flip-bits between the loaded premature data and the loaded main data; and
      a read retry operation component suitable for performing a read retry operation based on the number of the flip-bits and a read retry table in which levels of a plurality of read voltages are recorded.

2. The memory device of claim 1, wherein the read retry table is stored in the read retry operation component, and the levels of plurality of read voltages have a priority.

3. The memory device of claim 1, wherein each of the page buffers includes a sub-latch onto which the premature data is loaded and a main latch onto which the main data is loaded.

4. The memory device of claim 1, wherein the premature data is loaded onto the sub-latch at a first loading time, and the main data is loaded onto the main latch at a second loading time, wherein the second loading time is a time when data loading is completed, and the first loading time is earlier of the second loading time.

5. The memory device of claim 2, wherein the detection component compares the number of the flip-bits with a predetermined threshold value.

6. The memory device of claim 5, wherein, when the detected number of the flip-bits is equal to or greater than the predetermined threshold value, the read retry operation component compares a number of times of a read retry operation with a predetermined number.

7. The memory device of claim 6, wherein, when the number of times of the read retry operation is smaller than the predetermined number, the read retry operation component adjusts a corresponding read voltage based on the read retry table, and controls to perform a series of operations of loading the premature data and the main data, detecting the number of the flip-bits and comparing the number of the flip-bits with the predetermined threshold values, based on the adjusted read voltage.

8. The memory device of claim 6, wherein, when the number of times of the read retry operation is equal to or greater than the predetermined number, the control circuit performs an eBoost algorithm on the main data.

9. The memory device of claim 5, further comprising:
   a data input/output circuit suitable for outputting the main data received from the read/write circuit to an external device when the number of the flip-bits is smaller than the predetermined threshold value.

10. The memory device of claim 1, further comprising:
    an address decoding circuit suitable for applying the read voltage to the word lines based on the address signal.

11. An operating method of a memory device that performs a read operation based on a read command and an address signal which are transferred from an external device, the operating method comprising:
    applying a read voltage to a word line corresponding to the address signal;
    loading premature data and main data onto a page buffer coupled to a bit line corresponding to the address signal, at different times;
    detecting the number of flip-bits between the premature data and the main data; and
    performing a read retry operation based on the number of the flip-bits and a read retry table in which levels of a plurality of read voltages are recorded.

12. The operating method of claim 11, wherein the levels of the plurality of read voltages have a priority.

13. The operating method of claim 12, further comprising:
    comparing the number of the flip-bits with a predetermined threshold value.

14. The operating method of claim 13, further comprising:
    when the number of the flip-bits is equal to or greater than the predetermined threshold value, the number of times of performing of the read retry operation is compared with a predetermined number.

15. The operating method of claim 14, further comprising:
    when the number of times of performing of the read retry operation is smaller than the predetermined number, adjusting a corresponding read voltage based on the read retry table, and controlling to perform a series of operations of the loading of the premature data and the main data, detecting of the number of the flip-bits and comparing of the number of the flip-bits with the predetermined threshold values, based on the adjusted read voltage.

16. The operating method of claim 14, further comprising:
    performing an eBoost algorithm on the main data when the read retry operation is equal to or greater than the predetermined number.

17. The operating method of claim 13, further comprising:
    outputting the main data received from a read/write circuit included in the memory device to an external device when the number of the flip-bits is smaller than the predetermined threshold value.

18. The operating method of claim 11, wherein the page buffer includes a sub-latch onto which the premature data is loaded and a main latch onto which the main data is loaded.

19. The operating method of claim 11,
wherein the premature data is loaded onto the sub-latch at a first loading time, and the main data is loaded onto the main latch at a second loading time,
wherein the second loading time is a time when data loading is completed, and the first loading time is earlier of the second loading time.

20. A memory device, comprising:
a memory cell array including a plurality of memory cells coupled to a plurality of word lines and a plurality of bit lines;
a plurality of page buffers coupled to each of the plurality of bit lines, each page buffer including a sub-latch suitable for loading premature data and a main latch onto suitable for loading main data;
a power supply circuit suitable for applying a read voltage to a word line; and
a control circuit suitable for controlling the memory cell array, the plurality of page buffers and the power supply circuit to perform a read operation and a read retry operation,
wherein the control circuit loads the premature data and the main data at different times, detects a number of flip-bits between the premature data and the main data, and performs a read retry operation based on the number of the flip-bits and a read retry table in which levels of a plurality of read voltages are recorded.

* * * * *